United States Patent [19]

Smith

[11] 4,115,766

[45] Sep. 19, 1978

[54] SEMICONDUCTOR APPARATUS FOR ANALOG TO DIGITAL CONVERSION

[75] Inventor: George Elwood Smith, Murray Hill, N.J.

[73] Assignee: Bell Telephone Laboratories, Incorporated, Murray Hill, N.J.

[21] Appl. No.: 783,342

[22] Filed: Mar. 31, 1977

[51] Int. Cl.² .................................. H03K 13/09
[52] U.S. Cl. ........................ 340/347 AD; 357/24
[58] Field of Search ....... 340/347 M, 347 AD, 347 C, 340/173 R; 307/221 D; 357/24

[56] References Cited

U.S. PATENT DOCUMENTS

3,745,555 7/1973 Carbrey ..................... 340/347 M
3,930,255 12/1975 Means ......................... 357/24 X Primary Examiner—Charles D. Miller
Attorney, Agent, or Firm—D Caplan

[57] ABSTRACT

An analog electrical signal is converted into a binary digital signal by means of an arrangement of semiconductor surface potential wells. During operation, this arrangement converts the analog electrical signal into an analog signal charge packet in one of these potential wells and sequentially subtracts from this analog packet a sequence of reference charge packets representing the binary digital bits of the analog signal, provided that the then remaining signal charge packet is greater than the reference charge packet.

18 Claims, 17 Drawing Figures

SEMICONDUCTOR APPARATUS FOR ANALOG TO DIGITAL CONVERSION

BACKGROUND OF THE INVENTION

1. Field of the Invention

This invention relates to semiconductor apparatus, and more particularly to semiconductor devices for analog-to-digital conversion.

2. Description of the Prior Art

In the field of telephone communications, it is desirable to convert an input analog signal into a binary digital output signal, in order to perform more cheaply such signal processing functions during transmission as amplification at various points along the transmission path. On the other hand, present-day analog-to-digital converters themselves tend to be expensive, owing to their hybrid structures with precise required tolerances, that is, structures requiring very accurate elements not in the form of compact integrated circuits.

As is well known in the art of charge coupled devices (CCD), a potential "well" in a surface region of a semiconductor body can be formed in response to a suitable voltage that is applied to an overlying electrode separated from the surface of the body typically by a thin insulating layer. This potential well can serve as a storage site for electrical charge carriers, such as those injected or transferred into the site in accordance with an analog signal input. These injected charges can then be introduced into the well by means of various techniques, as known in the art of semiconductor charge transfer devices. A plurality of these potential wells can thus be used for distributing analog charge over one or more of such wells.

In U.S. Pat. No. 3,958,210, issued to P. A. Levine on May 18, 1976, a system for analog-to-digital conversion was disclosed, including a semiconductor charge coupled device utilizing the properties of potential wells. However, the semiconductor charge coupled device portion of that system produced only a digital counting representation (unitary based number system) of the input analog signal, and the system required complex logic circuitry to convert this unitary digital (counting) representation into the ultimately desired representation in the binary number system. In other words, an analog input representing the number $n$ was converted by the charge coupled device portion into a sequence purely of $n$ "ones" $(1,1,1,\ldots 1,1,1)$ according to the unitary number system, rather than directly into the desired binary sequence of both "ones" and "zeros". Complex logic circuitry was thus required for subsequent conversion into a representation of the number $n$ in the binary number system, that is, into a binary digital sequence, such as $(1,0,1,\ldots 0,1,1)$ representing the number $n = 1 \times 2^i + 0 \times 2^{i-1} + 1 \times 2^{i-2} + \ldots + 0 \times 2^2 + 1 \times 2^1 + 1 \times 2^0$, where $i$ is selected such that $1 \times 2^i$ is the "most significant bit" in the number $n$. Also, the accuracy depends on all of the many wells being the same.

Accordingly, it would be desirable to have semiconductor apparatus for directly converting an analog signal directly into a binary digital number representation.

SUMMARY OF THE INVENTION

A pair of substantially identical surface potential wells is interconnected by a gate ("port") surface region in a semiconductor body. This gate region is associated with, and defined in extent by, an overlying gate electrode for controlling the flow of charge from one well to the other well through this gate region. Analog signal charge, injected into the semiconductor body in accordance with an analog signal input, is initially transferred into one of the wells. If, and only if, the surface potential of this well due to the charge in this well exceeds a reference level corresponding to the most significant binary bit, this charge is then distributed equally over both wells by means of charge flow from one well to the other well through the gate region between these wells until the surface potentials of these wells are in mutual equilibrium. Then, some of the charge from the other wall is transferred through the gate region back into the one well until the surface potential of the latter well attains the reference value corresponding to the most significant bit. In this way, the portion of the signal charge remaining in the other well represents the original analog signal charge less the most significant bit. The process can then be repeated using this remaining charge as a new analog charge, in order to determine the other lesser bits in the desired digital numeral system.

In a specific embodiment of the invention (FIG. 1), an analog-to-digital converter includes an arrangement of semiconductor surface potential wells, each having an overlying electrode, located on a major surface of a semiconductor body. A first pair of these wells (called the "signal A well" and the "signal B well", respectively) are substantially identical. A controllable surface gate region is located between the signal B well and the signal A well, in order to connect and mutually equilibrate the surface potentials of these wells by enabling the transfer of charge between these wells through this gate region. A second pair of potential wells (called the "auxiliary well" and the "sump well", respectively) are separated by a second controllable surface gate region. This second gate region is controlled by no overlying gate electrode which is conductively (ohmically) connected to the electrode overlying the signal A well ("signal A plate"). The electrode overlying the auxiliary well is conductively connected to the electrode overlying the signal B well ("signal B plate"). The sump well has another gate region for entrance of charge from a charge source "reservoir," and yet another gate region for exit of charge to a charge sink. This latter gate region is controlled by an overlying electrode conductively connected to the reference A plate. During operation, an analog charge packet proportional to the analog input is formed in the signal A well and is then compared with a first reference level corresponding to a first (largest) trial for the "most significant bit." If, and only if, the analog charge exceeds this reference level, then this charge is distributed and equilibrated over the signal A and the signal B wells; otherwise, the reference level is halved to a second reference level and the analog charge is again compared with this second reference level, and this process of halving the reference level is repeated if necessary until the original analog signal first becomes greater than one of the reference levels. Charge is then controllably introduced into the sump from the reservoir, thereby filling the sump well and causing the transfer of charge from the sump well to the auxiliary well until the surface potential of the auxiliary well rises to a "reference" voltage level at which time the sump then transfers charge from the reservoir to the charge sink instead of further into the auxiliary well. This flow of charge into the auxiliary well induces a flow of signal charge from the signal B well to the signal A well, this flow of signal charge terminating when the surface potential of the auxiliary well rises to the "reference" level. This reference level is pre-selected such that the charge transferred from the signal B well to the signal A well corresponds to the most significant binary bit of the original signal. Thereby, the portion of signal charge remaining in the signal B well corresponds to the lesser remaining bits (if any) of the original signal.

The "reference" voltage level is determined by one of another pair of substantially identical "reference" potential wells where one of these reference wells is initially filled with reference charge carriers and then shares this charge equally with the other reference well, thereby establishing the appropriate level for the "most significant bit" of charge distributed in the signal B and signal A wells in a manner independent of nonlinearities of capacitance (voltage vs. charge) in both signal and reference wells. This reference level is attained in the signal A well when the charge therein corresponds to the "most significant bit".

Readjustment of the reference level for the next lower significant bit can be obtained by distributing the reference charge equally over the reference wells, thereby halving the reference charge in the reference well used for determining the next lower significant bit in the signal charge then remaining in the signal B well, that is, after transfer of the most significant bit of signal charge from the signal B well to the signal A well. In this way, reference levels for determining the lesser significant bits (if any) in the signal can be obtained.

BRIEF DESCRIPTION OF THE DRAWINGS

This invention, together with its features, objects, and advantages can be better understood from the following detailed description when read in conjunction with the drawings in which:

FIGS. 5.1 through 5.13 are schematic diagrams of various portions of the apparatus shown in FIG. 1, helpful in understanding operation in accordance with a specific embodiment of the invention.

For the sake of clarity only, none of the drawings is to scale.

DETAILED DESCRIPTION

As indicated in FIGS. 1, 2, 3, and 4, the top major surface of a monocrystalline N-type silicon semiconductor body 100 is provided with an array of highly doped P+ surface zones or regions (shaded areas in FIG. 1) of a major surface of the body together with an overlying array of electrodes (or "plates"). The impurity doping levels for the P and N+ regions are of the ordinary values used for conventional N-channel CCD operation, typically of the order of $10^{15}$ significant acceptor impurities per cubic centimeter for P-type silicon and of the order of $10^{19}$ significant donor impurities per cubic centimeter for N+ type silicon. The top surface of the body 100 is coated with a relatively thick (1,000 angstrom) silicon dioxide insulating layer in which the various overlying electrodes are embedded, as known in the CCD art. Advantageously, the silicon dioxide layer has a uniform quality, so that the underlying semiconductor surface regions have uniform electrical characteristics. Each of the overlying electrodes has a terminal for application of suitable control voltages or is connected by a metallization lead to another electrode; for example, electrode 13 is connected to electrode 28 by metallization (typically polysilicon) lead 25, electrode 15 to electrode 29 by metallization lead 26, and electrode 20 to electrode 31 by metallization lead 27. Although the drawing is not to scale, it should be emphasized that, advantageously, electrodes 12, 14, 16, 18, 21, 23, 29, 31, 33, and 35, which serve as gate electrodes to control transfer of charges between wells, are all at least about one or two orders (depending upon desired number of binary digits) of magnitude smaller in effective gate area (capacitance) than all the other electrodes, which serve as surface potential well electrodes to control the charge storage capacities of the underlying wells.

It should also be emphasized that it is important for proper operation that the well electrodes 13 and 15 be of substantially the same areas, to within 1% for 6 digit binary conversion, and that the well electrodes 20 and 22 be of substantially the same areas. Advantageously, and as customary in the art, the well electrodes all have planar undersurfaces located equidistant from and parallel to the surface of the semiconductor, in order to provide a uniform well characteristic. Typically, each of the well electrodes 13, 15, 20, and 22 is about 100 micron square (10,000 square micron) or more in size; while each of the gate electrodes 14 and 21 is about 10 micron square (100 square micron) or less in size.

It should be noted that when the electrical potential of a gate region located between two charge containing wells is being raised (FIGS. 5.3–5.4, 5.10–5.11), there is ordinarily a random fluctuation ("noise") in the amount of charge that results in the two wells contiguous with the gate region. In order to reduce this noise, the gate electrode can be split into three rectangular segments ("stripes"), one such stripe located at a first level of metallization overlying contiguously with respect to one of the wells, another such stripe located at the same first level of metallization but overlying contiguously with respect to the other of the wells, and the third such stripe located between the other two stripes at a second level of metallization different from the first level. The resulting surface potential profile in response to applied voltages can thus be made to resemble an inverted parabola with well determined apex (at the center of the gate region); thereby, when the potential of the gate electrode is raised, the charge in the gate region is divided into two well determined relatively noise-free halves for transfer into each of the neighboring wells. However, with sufficiently short gate channels (5 microns or less), the potential profile tends to be sufficiently non-flat for equal charge division. Moreover, in order to compensate for this nonvanishing amount of charge (causing higher surface potentials) transferred into the wells underlying the electrodes 20 and 22, by reason of a small but nonvanishing amount of charge storage capacity of the intervening gate region underlying the intervening gate electrode 21 (FIGS. 5.3–5.4), the area of each of the substantially equal electrodes 13 and 15 is made advantageously slightly less than the area of the substantially equal electrodes 20 and 22. More specifically, the area of each of the electrodes 13 and 15 is advantageously made equal to the area of the electrode 20 less one-half the area of the much smaller gate electrode 14, which, in turn, is made substantially equal to the area of the gate electrode 21.

Advantageously also, the size (area) of the auxiliary well plate 28 is made at least approximately the same as that of the signal B plate 13, in order to equalize charge handling capability. The area of the sump plate 30 is likewise advantageously made approximately equal to that of the auxiliary plate.

The N+ zone 11 serves as a source for injection of negative electrode charge carriers into the potential well formed underneath the electrode 13 in response to suitable applied voltages. The transfer of such charge carriers from the N+ zone 11 to this well is under the control of the semiconductor surface region underlying the electrode 12 acting as a gate valve with respect to such transfer of charges, by virtue of the advantageous overlapping (FIG. 2) of this electrode 12 with the N+ zone 11 and the electrode 13, as understood in the CCD art. Moreover, by suitable applied voltage, the N+ zone 11 can serve as a sink for the absorption of charge that may be stored in the surface potential well associated with the well electrode 13. Similarly, each of the N+ zones (or regions) 17, 19, 24, 32, and 36, respectively, serves as a charge source (or sink) for each of the surface potential wells underlying the well electrodes 15, 20, 22, 30, 34, respectively, subject to the control of gate electrodes 16, 18, 23, 31, 35, respectively. The various N+ zones and electrodes are separately conductively coupled to control circuitry represented symbolically by rectangular boxes 200, in order to provide electronic control over the instantaneous potential of these zones and electrodes, as described more fully below.

The well regions, such as the signal A and signal B wells (underlying the signal A and B plates) and the reference A and B wells (underlying the reference A and B plates) are delimited in lateral extents (FIG. 1) by the overlying electrode plates. However, the lateral extents of these well regions can also be delimited by other means, such as "chan-stop" regions just underneath the thick oxide surrounding these well regions. As understood in the art, a chan-stop region can be a highly doped surface region of the semiconductor substrate and of the same conductivity type as the region of the substrate where the wells are located.

In order to understand operation, it is important to note that a suitable positive-going potential of $V_W$ on a well electrode tends to enable the surface region underlying that electrode to retain excess minority charges (electrons) introduced into the resulting "well", as known in the CCD art. Conversely, a suitable negative-going potential $V_R$ tends to empty the well of any such minority charges. Typically, $V_W$ is about 17 volts and $V_R$ is about 5 volts, relative to substrate potential. It should also be noted that the regions of relatively thick oxide located between all well electrodes tend to produce barrier surface potentials in the semiconductor, which prevents flow of charge from one well to another; thus, the only way charges can shift from one well to another is through a gate surface region located between the two wells and underlying a gate electrode to which a suitable negative-going potential is being applied, the gate region being contiguous to both wells.

As known in the art, the oxide thickness overlying those surface regions of the semiconductor which are not controlled by overlying electrodes (in combination with the impurity doping at the semiconductor surface) is sufficient to render the surface potential of these surface regions equal to the bulk substrate potential at all times during operation. Thus, at all times during operation, the semiconductor surface potential underlying the thick oxide is indeed higher than that which obtains under any of the electrodes, as indicated in the surface potential profiles shown in FIGS. 5.1–5.13.

In view of the various functions that are performed by the various well electrodes and gate electrodes during operation, it is convenient to denote these electrodes by labels in accordance with the following table:

| Electrode | Nomenclature |
|---|---|
| 13 | signal B plate |
| 15 | signal A plate |
| 20 | reference A plate |
| 22 | reference B plate |
| 28 | auxiliary plate |
| 30 | sump plate |
| 34 | reservoir plate |
| 29 | signal A gate |
| 31 | reference A gate |
| 33 | sump gate |

It should be noted that, although the surface potential of a well in the absence of charge therein is not precisely the same as the potential of the electrode overlying such a well, nevertheless the resulting difference of potentials will be relatively small and of little importance when using a sufficiently thin and uniform oxide layer between electrode and semiconductor surface as known in the art. Moreover, this small difference of potentials tends to cancel out in the practice of this invention, since the oxide has the same quality and thickness at different wells. Accordingly, the description of operation below will not take into account this small difference of potentials.

The method of operation will now be described in conjunction with FIGS. 5.1 through 5.13, showing in symbolic form the various gate and well electrodes of FIG. 1, together with the corresponding surface potential profile. Although the sump electrode 30 is indicated in two distinct locations in FIGS. 5.1–5.13, it should be understood that this duplication of the sump electrode is only for the purpose of illustrating along one dimension the two dimensional functioning of the underlying sump well, that is, both along the cut 3—3 and the cut 4—4 of FIG. 1. In FIGS. 5.1–5.13, any electrode to which the potential $V_R$ is being applied is labeled with the letter "R" at its terminal; any electrode to which the potential $V_W$ is being applied is labeled with the letter "W". Shaded areas in FIGS. 5.1 through 5.13 represent excess electron charge carriers. Such excess carriers are always present in the doped N+ regions. On the other hand, excess charge carriers can be present in a (undoped) potential well only after transfer thereto either from an N+ region or from another well that previously contained excess charge.

Figure 51:
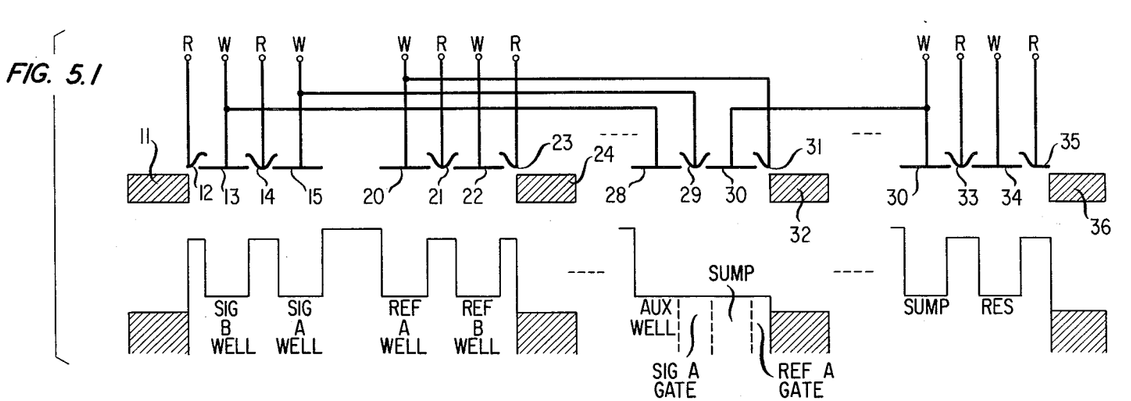

During operation initially the voltages $V_R$ and $V_W$ are applied to the various electrodes of the array as indicated in FIG. 5.1, in order to produce empty wells (devoid of excess charge) in the semiconductor under the signal B and A plates, the reference B and A plates, the sump plate, and the reservoir plate. The surface potential profile that thereby results for electrons is indicated in FIG. 5.1 just beneath the electrode array. The shaded areas of this profile, representing the N+ zones, are advantageously always maintained at potential levels below $V_W$ (except when such one of the N+ zones is injecting charges to a well). It should be noted that, by reason of ohmic interconnection, the potential level on the signal A gate 29 is always the same as that of the signal A plate 15. Likewise, the potential of the reference A gate 31 is the same as that of the reference A plate 20; and similarly the potential of the auxiliary plate 28 is the same as that of the signal B plate 13.

Figure 52:
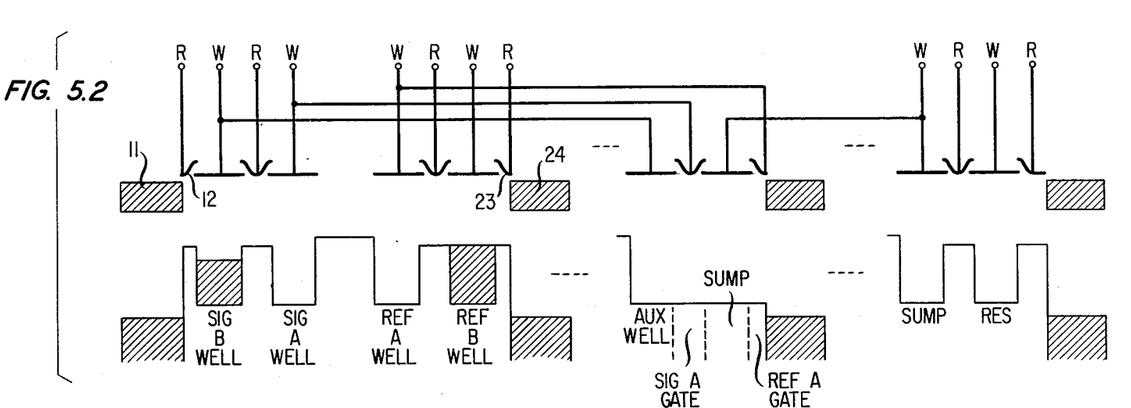

As indicated in FIG. 5.2, the reference B well is filled with a full "bucket" of charge, which will hereafter be called the "reference" charge, whereas the signal B well is partially filled with "signal" charge corresponding to the value of the analog signal. The introduction of these charges into the signal B and reference B wells can be accomplished in accordance with the well known CCD techniques. For example, by suitable control over the potentials of the N+ zone 11 and the gate electrode 12, the signal charge is introduced into the signal B well; and by suitable control over the potential of the N+ zone 24 in combination with the potential of the gate electrode 23, the reference charge is introduced into the reference B well. Such techniques are described, for example, in the book *Charge Transfer Devices*, by C. H. Sequin and M. F. Tompsett, pages 48-50, (Academic Press, 1975). Only for the sake of definiteness in the particular illustrative example being described in detail, the amount of charge under the signal B plate in FIG. 5.2 is indicated as ¾ of a full bucket, that is, a signal corresponding to ½ again as great as ½ of a full bucket, the signal thereby corresponding to the number 110000 in 6-binary representation. The most significant bit in this particular signal thus corresponds to ½ a full bucket, the next lowest significant bit corresponding to ¼ of a full bucket, and all the other bits to an empty bucket.

It should be understood that a "full" bucket does not necessarily mean that the charges completely fill the potential well, which might perhaps cause charge spillage during transfer, but rather that a "full" bucket is to be understood to mean the maximum amount of charge to be introduced into the well as determined by the applied voltages to the electrodes. In any event, after the signal charge has been introduced to the signal B well and the reference charge into the reference B well, the gate electrodes 12 and 23 are returned to voltage $V_R$; and the N+ zones 11 and 24 are returned to their earlier values below $V_W$ (FIG. 5.2).

Figure 53:
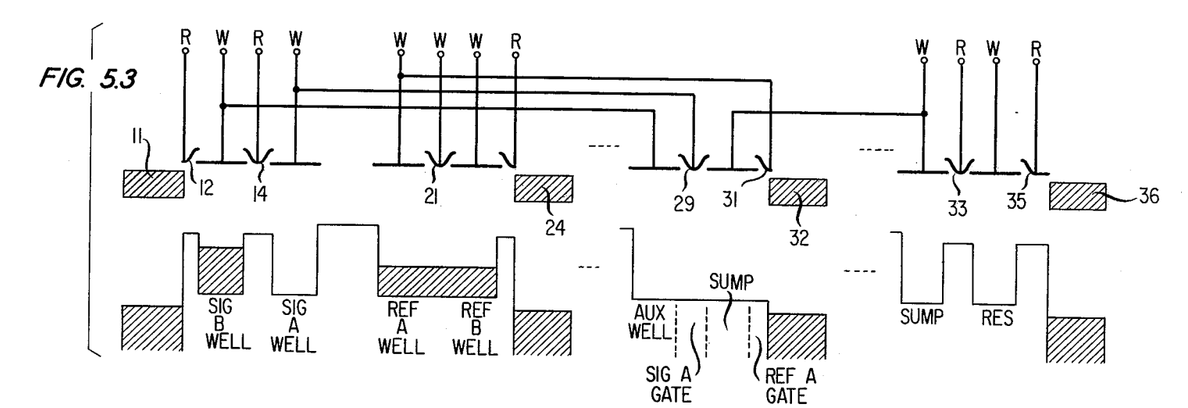

The next step is represented in FIG. 5.3. As indicated therein the reference charge has been split equally between the reference A and the reference B wells by virtue of a lowering to $V_W$ of the potential applied to the gate 21. In this way the reference A and reference B wells each contains ½ of a full bucket.

Figure 54:
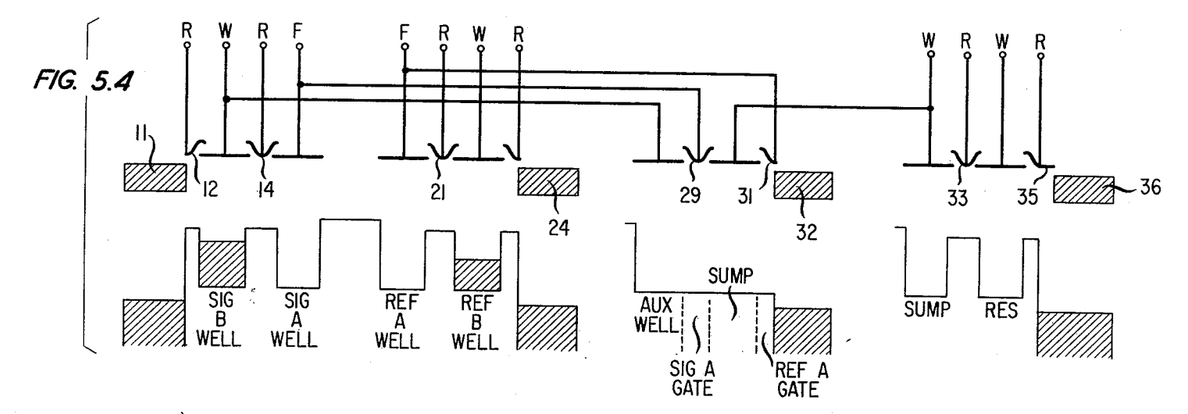

As indicated in FIG. 5.4, the potential applied to the gate 21 is raised to $V_R$, and then the reference A well is drained of all charge. This draining of the reference A well can be accomplished, for example, by means of a lowering of the potential of the gate electrode 18 to $V_W$ while the N+ zone 19 is being maintained at a potential below $V_W$. After the reference A plate has thus been drained of all excess charge, the reference A plate is then allowed to float electrically, as indicated by the label "F". Likewise, the signal A plate is also allowed to float. Therefore, for a relatively long time interval as compared with one operating cycle time corresponding to a single bit, which in turn is less than the thermal decay time, both the reference A plate and the signal A plate will remain at potential $V_W$ unless and until such plate potential is disturbed either by a flow of charges into the well or by an application of an external voltage to the plate. Thus, at the end of the foregoing steps the potential profile of the wells, and the amounts of charges (shaded areas) in the wells, are as shown in FIG. 5.4.

Figure 55:
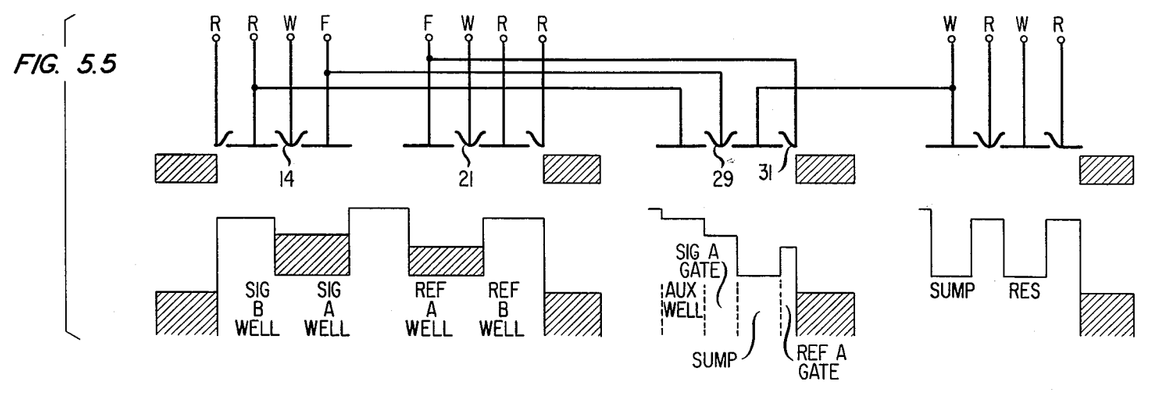

The next step, as indicated in FIG. 5.5, involves the transfer of analog signal charge into the signal A well and the transfer of reference charge into the reference A well, while both these signal A and reference A wells are electrically floating. These transfers are advantageously accomplished by a lowering of the potential of the gate electrodes 14 and 21 to $V_W$ followed by a raising of the potentials on both the signal B plate and the reference B plate to $V_R$, while the signal A plate and the reference A plate are kept floating. By reason of the fact that the signal A plate is thereby being partly filled with charge during a time when this plate is floating, the potential on the signal A gate 29 will equilibrate to that corresponding to the surface potential of a well that is partly filled in accordance with analog signal. Likewise, by reason of the ohmic connection of the gate electrode 31 to the reference A well electrode and of the fact that the reference A plate was half-filled with reference charge at a time the reference A plate was floating after having earlier been at a potential $V_W$, the reference A gate electrode 31 will be brought to a potential corresponding to a half-filled underlying well (except for the small amount of charge underneath gate electrode 21). Also, the potential of the auxiliary well, by reason of its ohmic connection 25 with the signal B plate, will be brought to a potential corresponding to the potential $V_R$ of this signal B plate.

Figure 56:
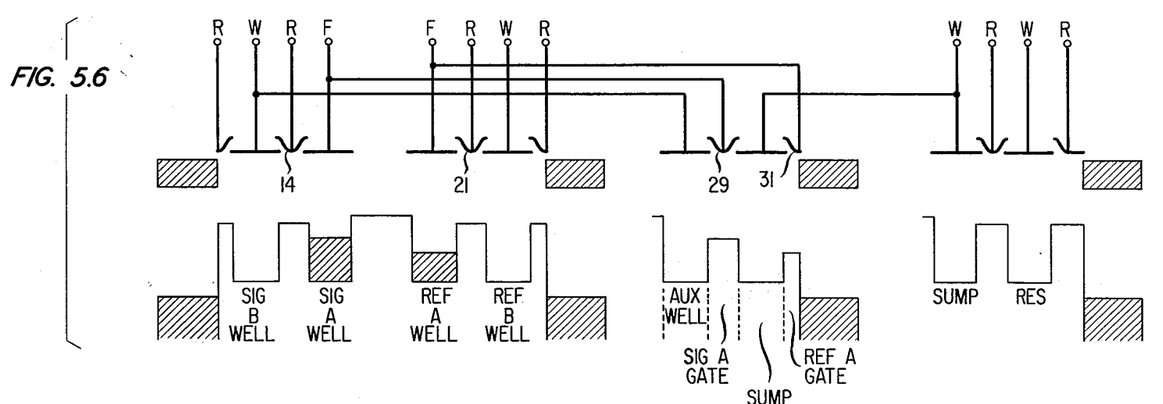

The next step (FIG. 5.6) involves the raising to $V_R$ of the potential of the gates 14 and 21, followed by the lowering of the potentials of both the reference B plate and the signal B plate to $V_W$, thereby returning the auxiliary well to the potential $V_W$ and bringing the reference A gate electrode potential just to a half-filled well equivalent. The sensing and comparing circuitry 201 (FIG. 1) then detects whether the signal charge in the signal A well is greater than the charge in the reference A well, by means of a gated flip-flop detector in this circuitry 201, for example. The desired binary representation is thus provided by the sequence of the results of such comparisons: "1" if the potential of the signal A well is greater than that of the reference A well, "0" otherwise. These results are transmitted by a conductive lead 202 to the control circuitry 200.

If, contrary to the illustrative example, there is insufficient signal charge for the surface potential in the signal A well to be greater than the surface potential of the reference A well (binary "0"), then this means that the most significant bit in the signal is less that ½ a full bucket. In such a case, the reference charge is split once again over the reference A and reference B wells similar to the condition of FIG. 5.3 (except now each reference well is but ¼ full), and then the reference A well is drained (similar to FIG. 5.4), and then the reference charge (namely ¼ of a full bucket) is transferred into the reference A well at a time when the latter well is floating (similar to FIG. 5.5). However, in the illustrative example under consideration of an analog signal equal to ¾ of a full bucket, it is assumed that the analog signal is indeed sufficiently large, so that the most significant bit corresponds to ½ a full bucket, and so there is indeed sufficient signal charge in the floating signal A well to make its potential larger than the potential of the floating reference A well (binary "1").

Figure 57:
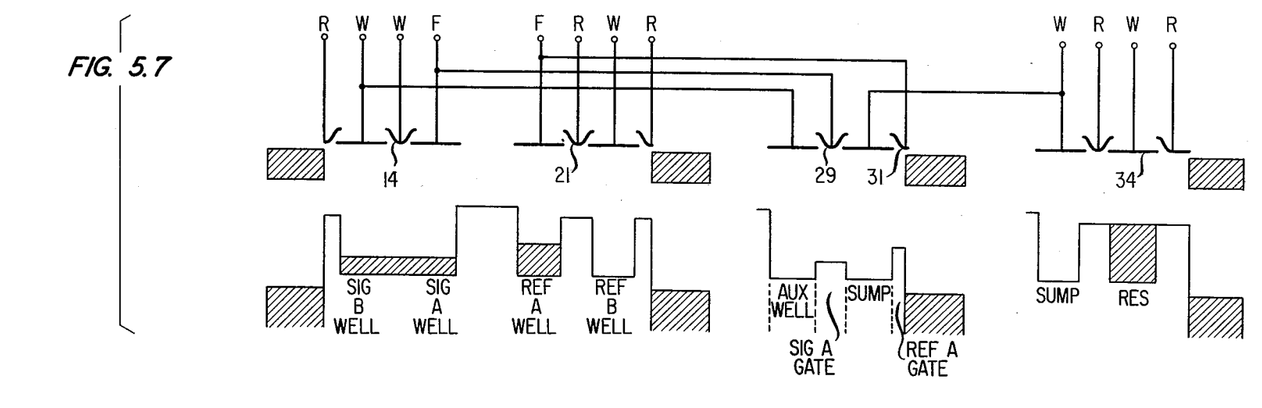
Figure 58:
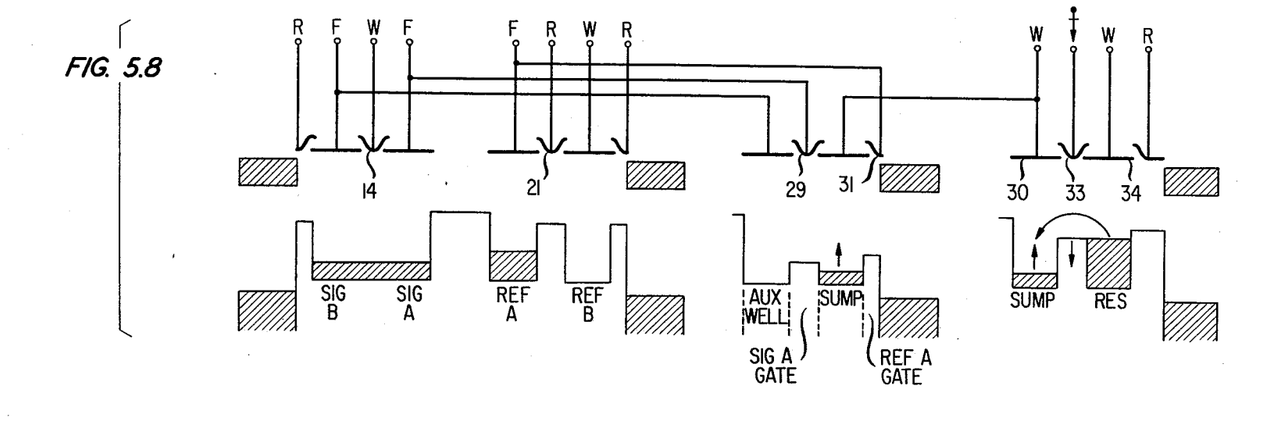
Figure 59:
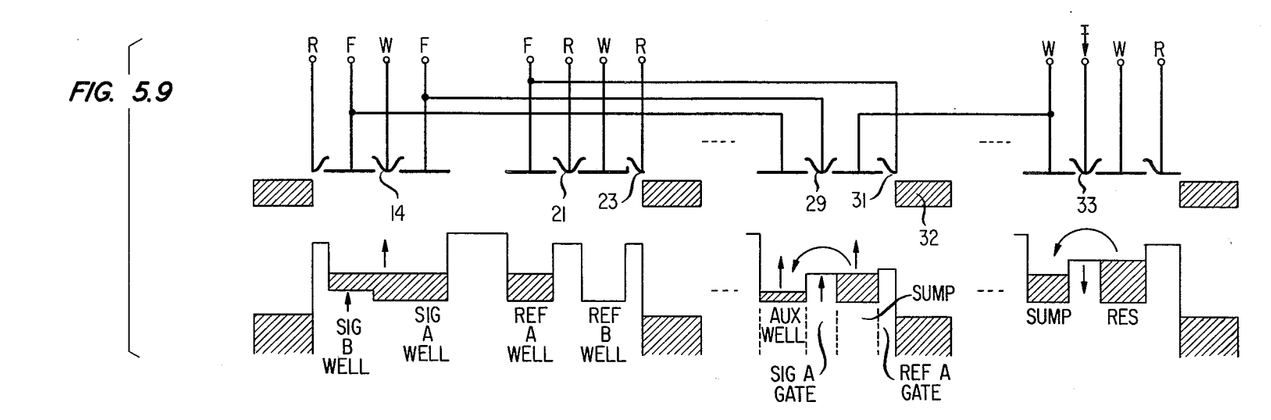

The next step (FIG. 5.7) involves the introduction of charge to fill the reservoir well underlying the reservoir plate 34, and the distributing of the signal charge equally over the signal A and B wells by means of a lowering of the gate 14. By virtue of the concomitant reduction (by a factor of 2) of charge in the signal A well, the surface potential under the signal A gate 29 is correspondingly reduced. At this time in this illustrative example, the signal A and B wells are both three-eighths (3/8) full, while the reference A well is one-half (1/2) full. The signal B well is then electrically floated (FIG. 5.8).

The next step involve (FIG. 5.8–5.11) the controlled lowering of the sump gate electrode 33, as by means of a decreasing potential applied to this gate electrode, in order to transfer charge to the sump well underlying the sump plate 30. In an early stage (FIG. 5.8) of this lowering of the sump gate, the sump well surface potential has risen somewhat due to charge transfer thereto, but has not yet risen to the level of the surface potential either of the signal A gate or of the reference A gate. In an intermediate stage (FIG. 5.9) of this charge transfer to the sump well, the surface potential of this sump attains the value of that of the signal A gate, so that the flow of further charges from the reservoir to sump produces a charge flow over the signal A gate region into the auxiliary well, thereby correspondingly increasing the potential of the auxiliary well plate. This increasing potential of the auxiliary well induces a corresponding transfer of signal charge from the signal B well to the signal A well as caused by the consequent raising of the "bottom" level of the electrically floating signal B well (the "bottom" of a well being the level of surface potential in the absence of charge in this well). On the other hand, this transfer of charge from the signal B to A wells itself produces a rise in the surface potential (at the "top") of the signal A well, which in turn raises the surface potential of the signal A gate. More specifically, FIG. 5.9 depicts the condition where the auxiliary well is (1/8) full, so that the "bottom" of the signal B well is pushed up by said (1/8) of a full well, thereby rendering the signal A well seven-sixteenths (7/16) full (but only approximately, owing to small amount of charge in the gate 14). Hence, the surface potential of the signal A gate rises to the value corresponding to (approximately) seven-sixteenths (7/16) of a full well also. Accordingly, the charge level in the sump likewise rises to (approximately) seven-sixteenths (7/16) of a full well. Thereafter, the sump continues to spill further charge being received from the reservoir into the auxiliary well, until the condition illustrated in FIG. 5.10 is attained.

Figure 510:
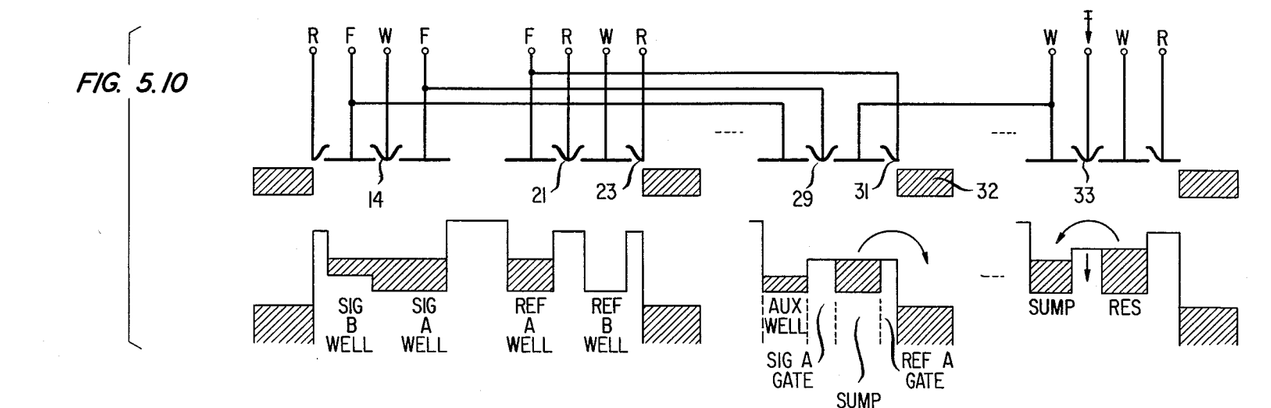
Figure 511:
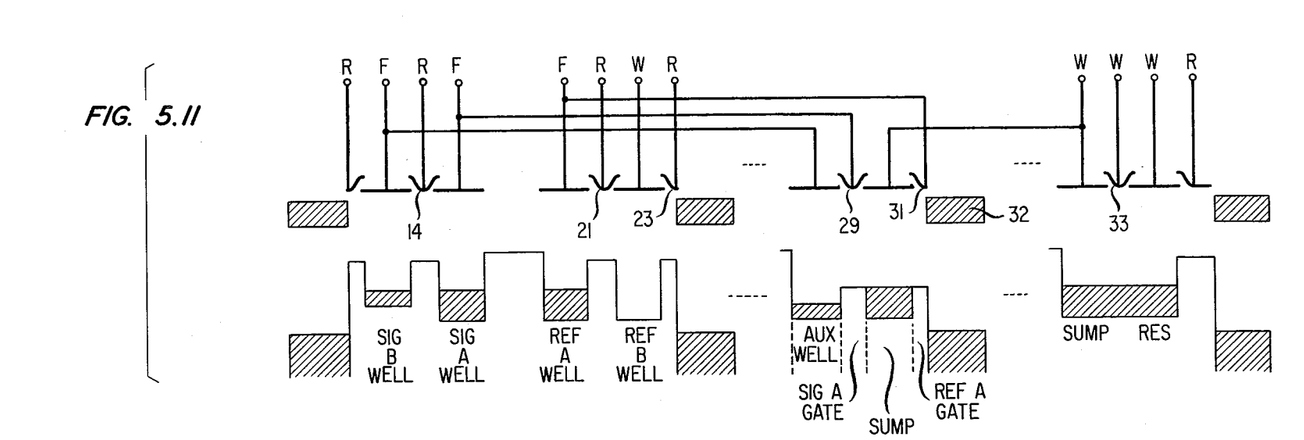
Figure 512:
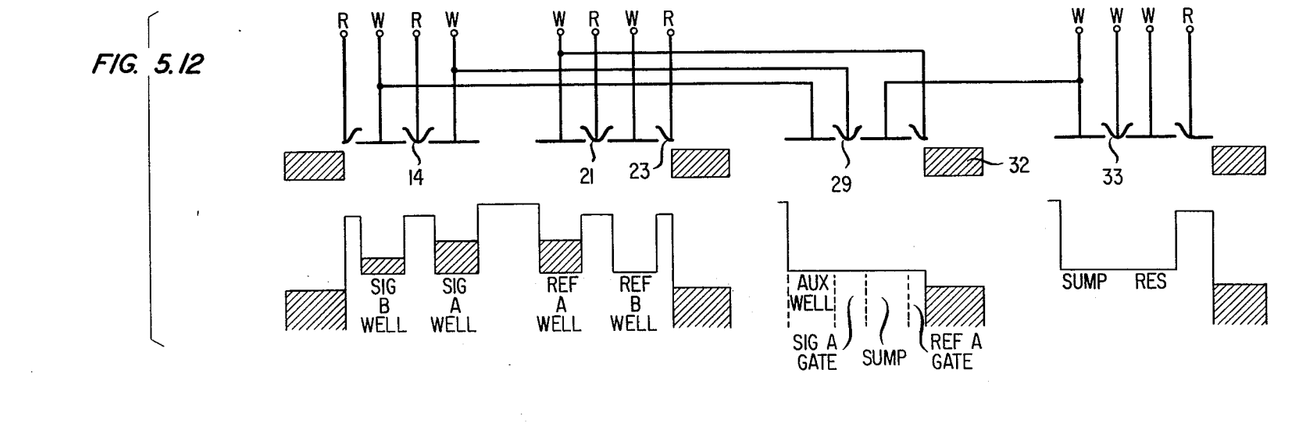
Figure 513:
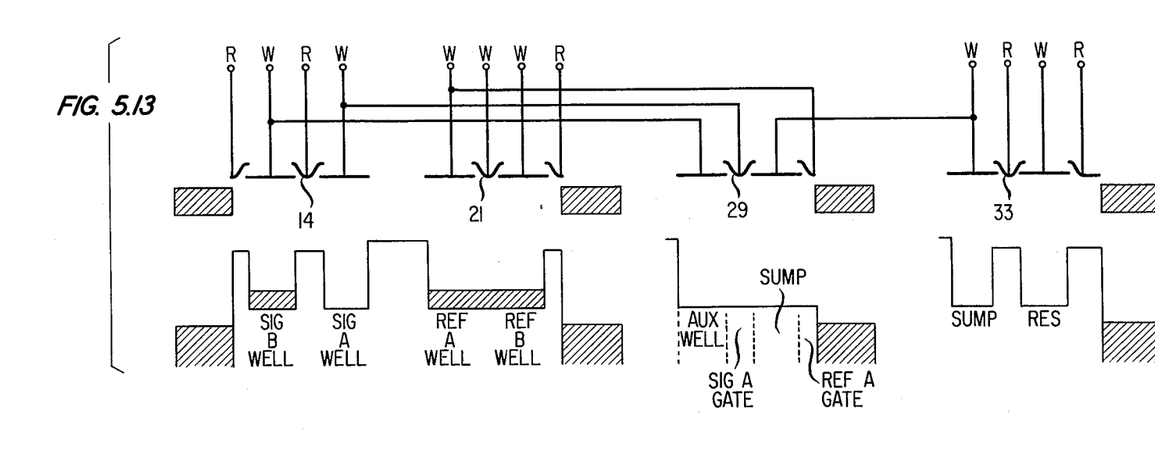

As indicated in FIG. 5.10, the surface potential of the sump charge subsequently attains the level equal to (more precisely: infinitesimally higher than) the reference A gate surface potential, that is, one-half (1/2) a full well. At this time further excess sump charge (caused by further transfer from the reservoir) begins to flow over the reference A gate region into the N+ zone 32, rather than into the auxiliary well as previously. Charge from the sump continues to spill into this N+ zone 32 until the reservoir no longer feeds charge into the sump (FIG. 5.11) by reason of equilibration of reservoir and sump. Accordingly, the reservoir should have a sufficient storage capacity (sufficient area of overlying reservoir plate) for this type of operation. Since in general the auxiliary well can be as much as half-filled (although only one-quarter filled in the illustrative example) with charge supplied by the sump but ultimately from the reservoir, the auxiliary well and the sump well are made advantageously of approximately equal storage capacities, whereas the reservoir should have a somewhat higher capacity equal approximately to that of the auxiliary well plus sump.

As a result of the previous spilling of charge from sump to auxiliary well until the sump surface potential attains the reference A level (FIG. 5.10), the auxiliary well is filled with charge to a level determined at the instant the surface potential under the signal A gate 29 attains the value of the surface potential under the reference A gate 31 and hence of the surface potential of the reference A well. After the decreasing potential being applied to the sump gate electrode 33 has attained $V_W$ (FIG. 5.11), the potential applied to the gate electrode 14 (between the signal A and B wells) is raised to $V_R$. As shown below, in general (and not merely in the illustrative example) the charge thus now contained in the signal A well is equal to the reference charge in the reference A well, thus leaving in the signal B well the original signal charge less this reference charge, that is, the analog signal charge less the most significant bit, as is desired for the next steps (determination of next lower significant bit) for analog to digital conversion.

FIGS. 5.12 and 5.13 illustrate the resetting of the apparatus, in preparation for ascertaining the next lower significant bit. For this purpose, the external voltage $V_W$ is applied to the signal B and signal A plates as well as to the reference A and B plates, thereby emptying into the N+ zone 32 (maintained at a potential below $V_W$) all charge from the sump, the auxiliary well, and the reservoir (FIG. 5.12). Then, the external voltage $V_W$ is applied to the gate electrode 16 (FIG. 1), thereby emptying all excess charge from the signal A well into the N+ zone 17 (maintained at a potential below $V_W$) acting as a charge sink. Next, the external voltage $V_R$ is applied to this gate electrode 16 as well as to the sump gate electrode 33 (FIG. 5.13); while the external voltage $V_W$ is applied to the gate electrode 21, in order to split the remaining reference charge and reduce its value to (1/4) of a full well. At this juncture (FIG. 5.13), the apparatus is in the same condition as previously described in conjunction with FIG. 5.3, except that now (FIG. 5.13) the signal B well has been reduced by the most significant bit and the reference charge is now just half as much. Thus, by a subsequent repetition of the steps illustrated and described above in connection with FIGS. 5.3 and 5.13, the next lower significant bit can be determined, and so on for the remaining lower significant bits.

In order to understand in somewhat more general terms the operation during the steps illustrated in FIGS. 5.8–5.11, it is convenient to denote the original signal charge by (1/2 + $e$), where 1/2 is the most significant bit (equal to one-half a full well) and where "$e$" is a number less than 1/2. Thus, initially (FIG. 5.8) the signal A and B wells will each contain charge in the amount of 1/2 (1/2 + $e$) = 1/4 + $e$/2. As the auxiliary well is furnished charge in the amount of "$d$" from the sump (FIG. 5.9), there will be a corresponding transfer of charge "$d$" from the signal B to the signal A well, thereby leaving the signal B well with charge in the amount of (1/4 + $e$/2 − $\delta$) and the signal A well with (1/4 + $e$/2 + $\delta$), where $\delta$ is determined by the various coupling capacitances of the wells. When the condition illustrated in FIG. 5.10 is attained, the sump potential level is just 1/2 (i.e., the reference A level) as is the potential of the signal A plate and hence the surface potential of the signal A well. Thus, the signal A well then contains charge also in the amount of just ½ (i.e., the then reference level), so that at this time ¼ + e/2 +δ = ½; thus, δ = ¼ − e/2; hence the signal B well then contains charge in the amount of ¼ + e/2 −δ = e, that is, the original signal charge less its most significant bit. Thus this new charge is ready for further processing to ascertain the next lower significant bit. The sequence of results sensed by the gated flip-flop detector 201 in the step described above in conjunction with FIG. 5.6 (i.e., charge in signal A well greater vs. less than charge in reference A well) represents the binary digit sequence of the desired binary number representation.

It should be mentioned that, as an alternative to using the N+ zone 11 and the gate electrode 12, the N+ zone 17 together with the gate 16 can be used to introduce the signal charge to the signal A well 15 and then this charge can be transferred through the gate 14 into the signal B well using CCD transfer techniques that are standard in the art. In this way, it is possible to eliminate the need for the N+ zone 11 and the gate 12. Likewise the N+ zone 24 and the gate 23 may be omitted; the reference charge is introduced into the reference B well by first introducing the reference charge into the reference A well from the N+ zone 19 through the gate 18, and then transferring this reference charge through the gate 21 into the reference B well.

It should be that nonlinearities in the charge vs. voltage characteristic (non-constant capacitance) of the various wells, which could have important impacts in the cases of the signal A and B wells and of the reference A and B wells, are all cancelled out in the practice of the above-mentioned sequence of steps. Thus, there are important advantages to having the areas (and contour shapes) of the signal A and B wells substantially identical, and likewise for the reference A and B wells. In this way, the signal charge is accurately distributed over the signal A and B wells, and the reference charge is accurately distributed over the reference A and B wells.

It should be noted that some of the principles of this invention are applicable to the reverse process, that is, to the process of digital to analog conversion. For such a purpose, the full well reference charge is split equally over the reference A and B wells, and the charge in, say, the reference B well is emptied into another collecting well (not shown) if and only if the corresponding maximum digit is a "1" (but not if a "0"), otherwise this charge is dumped into the N+ zone 24. Then the reference charge is split again, and the reference B well is emptied either into the aforementioned collecting well (not shown) or into the N+ zone 24 depending upon whether or not the next digit is a "1" or "0"; and so on for the remaining digits. The amount of charge finally present in the collecting well is then the desired analog charge representation of the binary digital number.

Figure 1:
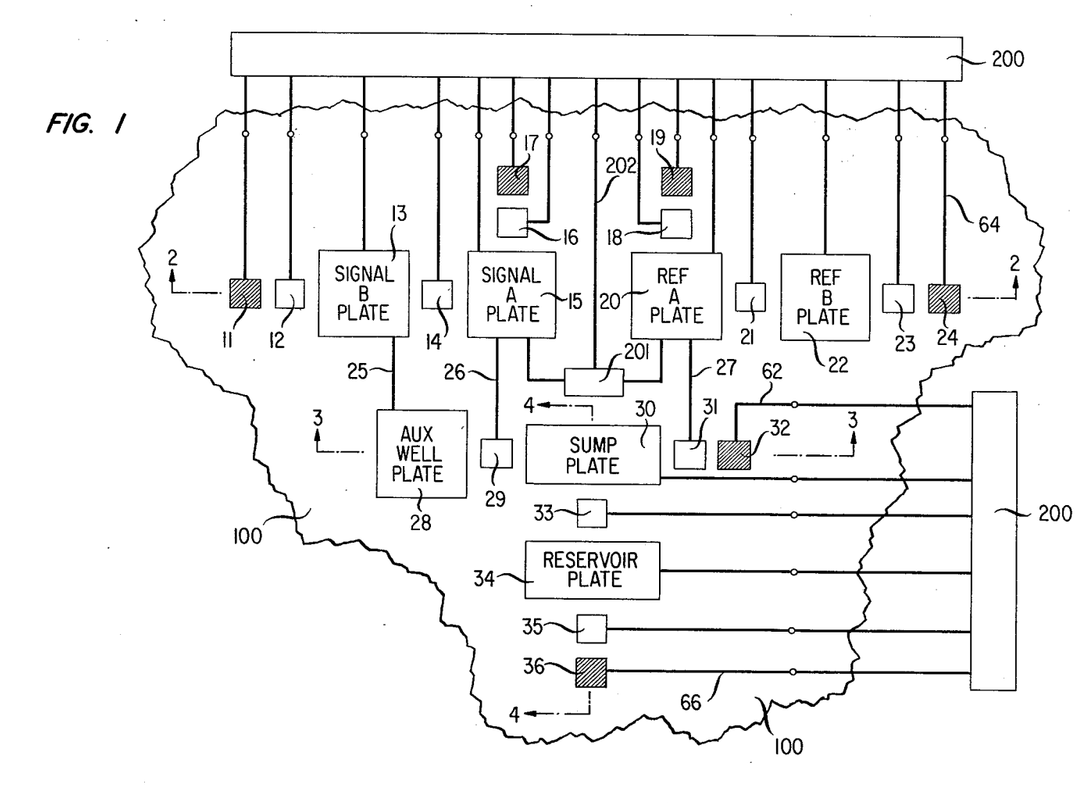
FIG. 1 is a plan diagram of semiconductor apparatus for analog-to-digital conversion in accordance with a specific embodiment of the invention.
Figure 2:
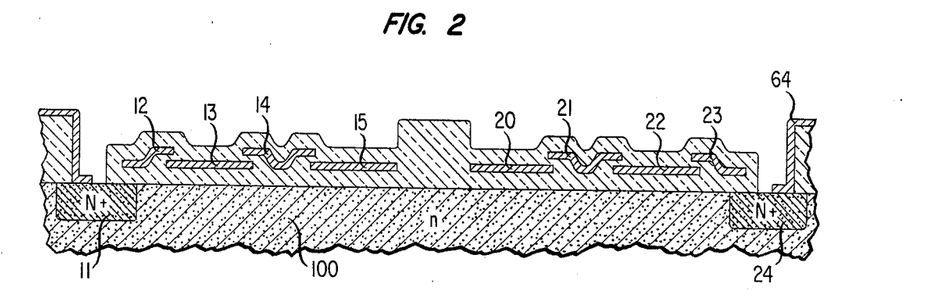
FIG. 2 is a side-view diagram of a cross section of the apparatus shown in FIG. 1.
Figure 3:
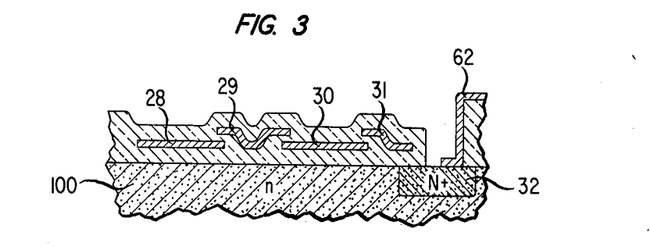
FIG. 3 is a side-view diagram of another cross section of the apparatus shown in FIG. 1.
Figure 4:
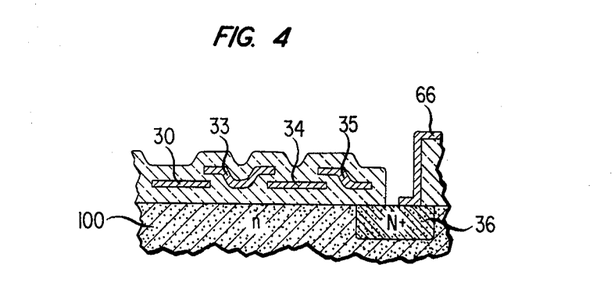
FIG. 4 is a side-view diagram of yet another cross section of the apparatus shown in FIG. 1.

Although the apparatus as illustrated in FIG. 1 indicates that the potential barrier surrounding the wells, such as the region between the signal B well and the reference A well, is attributable to a thicker overlying oxide layer thereat as compared to the oxide thickness between the overlying plates and the semiconductor surface; it should be understood that, alternatively or in addition thereto, this barrier can be produced or reinforced by means of an impurity chan-stop diffusion as known in the art.

Although this invention has been described in detail in terms of a specific embodiment, various modifications can be made without departing from the scope thereof. For example, many types of alternatives are known in the art for injecting charge into a well such as the reservoir 34. Also, P-MOS instead of N-MOS devices can be used in the practice of the invention by substituting P+ for N+, and N for P, type conductivity semiconductor.

What is claimed is:
1. Semiconductor apparatus comprising:
    (a) a semiconductor body having a major surface;
    (b) a sump well surface portion of said major surface, controlled electrically by an overlying sump well electrode, for storing charge supplied by a source of charge;
    (c) first and second substantially identical signal well surface portions of said major surface electrically controlled by first and second overlying signal well electrodes, respectively, of substantially equal areas for storing charge in accordance with an analog signal, plus a first gate region, electrically controlled by an overlying first gate electrode and located in said major surface between said first and second signal well portions, for controlling the transfer of charge between said signal well portions;
    (d) an auxiliary well surface portion of said major surface, electrically controlled by an overlying auxiliary well electrode, for collecting charge;
    (e) a second gate surface region of said major surface electrically controlled by a second overlying gate electrode located between said auxiliary well and said sump well plus means for ohmically connecting the second gate electrode to the first signal well electrode, for controlling the flow of charge from said sump to said auxiliary well in accordance with the surface potential of said first signal well in response to charge being introduced into said sump from the source of such charge; and
    (f) means for ohmically connecting an electrode overlying said auxiliary well to said second signal well electrode, in order to induce the transfer of charge from said second signal well into said first signal well in accordance with the charge in said auxiliary well.

2. Apparatus in accordance with claim 1 further comprising a third gate region in said major surface plus an electrode overlying said third gate region, for inducing the flow of charge from said sump to a charge sink region in said major surface in accordance with the surface potential of a reference well surface portion of said major surface.

3. Apparatus according to claim 2 in which the sump well has an overlying sump plate electrode for controlling the potential of said sump well.

4. Apparatus according to claim 1 in which the semiconductor is silicon.

5. Apparatus according to claim 2 in which the areas of the first and second signal wells are both greater than the areas of both the first and second gate regions by at least two orders of magnitude.

6. Semiconductor apparatus comprising:
    (a) first, second, third, fourth, fifth, and sixth separate surface well regions of a major surface of a semiconductor body, each of said regions defined in lateral extent by a separate overlying electrode that is spaced apart from the said surface of the body by an insulating layer;
    (b) first, second, third, and fourth gate surface regions in said major surface, the first gate located between said first and second well regions for controlling the flow of charge therebetween, the second gate located between said third and fourth well regions for controlling the flow of charge therebetween, the third gate located between the said fifth and sixth well regions for controlling the flow of charge therebetween, the fourth gate region located between said sixth well region and a charge sink, for controlling the flow of charge between said sixth well and said charge sink, the third gate region having a coextensive overlying electrode which is electrically connected to the electrode overlying the second well region, the fourth gate region having a coextensive overlying electrode which is electrically connected to the electrode overlying the third well region, and the first and second gate regions having separate coextensive overlying electrodes;

(c) means for introducing charge in accordance with an analog signal into the first well region;

(d) means for introducing charge in accordance with a predetermined reference level into the third well region; and (e) means for introducing charge into the sixth well region sufficient to produce overflow of charge from said sixth well into said fifth well and thence into said charge sink during operation.

7. Apparatus according to claim 6 in which the areas of all the electrodes overlying the said well regions are all at least two orders of magnitude greater than the areas of all the electrodes overlying the gate regions.

8. Apparatus according to claim 7 in which the semiconductor is silicon.

9. Apparatus according to claim 6 which further includes means for sensing and comparing the surface potential of the third region with the surface potential of the second region, in order to develop a digital signal representative of said analog charge.

10. Apparatus according to claim 9 further comprises circuit means for alternatively setting the potentials of the electrodes overlying the second and third well regions at a first value $V_R$ and a second different value $V_W$ and for electrically floating said electrodes.

11. Semiconductor analog to digital conversion apparatus comprising:

(a) a binary digital bit reference charge generating region, said generating region including first and second well electrodes located substantially parallel to and overlying, respectively, first and second spaced apart surface portions of a major surface of a semiconductor body, said first and second well electrodes defining, respectively, first and second reference well regions of said surface having substantially equal capacities for storing charge carriers, and further including third gate electrode means for controlling the transfer of charge carriers between said first and second surface portions, said third gate electrode having an area that is at least one order of magnitude less than that of said first well electrode;

(b) circuit means for controllably introducing charge carriers into said reference charge generating region and for controllably transferring charge between said first and second surface portions and for removing charge carriers from one of said well regions of said generating region, in order that said reference charge generating region contain a first amount of charge carriers at a first moment of time and substantially half the first amount of charge carriers at a second, later moment of time;

(c) a sump well surface portion insulatingly overlaid by a sump plate, said sump well surface portion of said body located in proximity to a first reference gate surface portion of said body insulatingly overlaid by a first reference gate electrode connected to said first reference well electrode;

(d) a first signal gate surface portion of said body insulatingly overlaid by a first signal gate electrode connected to a first signal plate insulatingly overlying a first signal well surface portion of said body; and (e) an auxiliary well surface portion of said body insulatingly overlaid by an auxiliary well plate connected to a second signal well plate insulatingly overlying a second separate signal well portion of said body, whereby, during operation, charge introduced into said sump well portion can flow through said first signal gate surface portion into said auxiliary well surface portion, thereby inducing transfer of a quantity of charge from said second signal well portion into said first signal well surface portion sufficient to raise the potential of the first signal gate surface portion to the potential of the first reference gate surface portion.

12. Apparatus according to claim 11 in which the first and second well electrodes are of substantially equal areas and are located substantially equidistant from said major surface.

13. Apparatus according to claim 12 in which the semiconductor is essentially silicon and the electrodes are separated from the major surface by a silicon dioxide insulating layer.

14. Apparatus according to claim 11 which further comprises a signal charge region including fourth and fifth well electrodes overlying, respectively, fourth and fifth spaced apart surface portions of said major surface, said fourth and fifth well electrodes located substantially parallel to and substantially equidistant from said major surface and defining, respectively, fourth and fifth well regions of said surface having substantially equal areas for storing analog signal charge carriers, and further including sixth gate electrode means for controlling the transfer of charge carriers between said fourth and fifth surface portions, said sixth gate electrode having an area that is at least two orders of magnitude less than that of said fourth well electrode, said fourth well electrode having an area substantially equal to the area of the first well electrode less one-half that of the third gate electrode.

15. Apparatus according to claim 14 which further includes circuit means for introducing charge carriers into said signal charge region in accordance with an analog input signal.

16. Semiconductor apparatus for analog signal to digital signal conversion comprising:

(a) first and second substantially identical signal well surface regions of a major surface of a semiconductor body, said wells electrically controlled by first and second, respectively, overlying signal electrodes in insulating relationship to said major surface;

(b) first means for introducing into the first well region a first amount of charge in accordance with the analog signal;

(c) second means for inducing the transfer of a second amount of charge from the first to the second well region through a gate surface region located between said first and second signal well regions, said gate surface region electrically controlled by an overlying gate electrode that has an area of at least two orders of magnitude less than that of the said signal electrode, whereby a third amount of charge, equal to the first less the second amount of charge, remaining in said first well region, corresponds to the analog signal less the most significant bit of said analog signal.

17. Apparatus according to claim 16 in which said second means includes an auxiliary well surface region of said major surface having an overlying auxiliary electrode that is ohmically connected to the first signal electrode and in which said second means further includes third means for introducing charge into said auxiliary well to a level sufficient for inducing said transfer of the second amount of charge from the first to the second well region.

18. A method for processing an analog signal into a digital signal which comprises the steps of:
  (a) comparing an analog charge packet in a first semiconductive storage site with a predetermined reference level, said packet having an analog charge content in accordance with the analog signal;
  (b) distributing said analog charge equally over said first storage site and a second storage site substantially identical with said first site provided said analog charge exceeds said reference level, and otherwise comparing said analog charge with a sequence of smaller predetermined reference levels until said analog charge exceeds one of said smaller reference levels and then distributing said analog charge over said first and second storage sites;
  (c) transferring charge from said second to said first site until the surface potential of said first site attains the predetermined reference level.

* * * * *